(12) United States Patent
Bai

(10) Patent No.: US 8,787,494 B2
(45) Date of Patent: Jul. 22, 2014

(54) MODELING DIGITAL PREDISTORTER

(75) Inventor: Chunlong Bai, Kanata (CA)

(73) Assignee: Telefonaktiebolaget L M Ericsson (Publ), Stockholm (SE)

(*) Notice: Subject to any disclaimer, the term of this patent is extended or adjusted under 35 U.S.C. 154(b) by 58 days.

(21) Appl. No.: 13/493,434

(22) Filed: Jun. 11, 2012

(65) Prior Publication Data

US 2013/0329833 A1 Dec. 12, 2013

(51) Int. Cl.
*H04K 1/02* (2006.01)

(52) U.S. Cl.
USPC .......... 375/297; 327/291; 332/106; 341/20; 341/173

(58) Field of Classification Search
USPC ........................................... 375/297
See application file for complete search history.

(56) References Cited

U.S. PATENT DOCUMENTS

| | | | |
|---|---|---|---|
| 6,141,390 A | 10/2000 | Cova | |
| 6,462,617 B1 | 10/2002 | Kim | |
| 6,642,786 B1* | 11/2003 | Jin et al. | 330/149 |
| 7,720,171 B2* | 5/2010 | Honcharenko et al. | 375/295 |
| 8,023,588 B1* | 9/2011 | Benson et al. | 375/297 |
| 8,238,849 B2* | 8/2012 | Pratt | 455/114.3 |
| 2003/0202615 A1* | 10/2003 | Bach et al. | 375/296 |
| 2004/0142667 A1* | 7/2004 | Lochhead et al. | 455/114.3 |
| 2004/0199559 A1* | 10/2004 | McAdam et al. | 708/322 |
| 2004/0252784 A1* | 12/2004 | Honcharenko et al. | 375/297 |
| 2005/0157814 A1* | 7/2005 | Cova et al. | 375/297 |
| 2005/0253652 A1* | 11/2005 | Song et al. | 330/149 |
| 2006/0229036 A1* | 10/2006 | Muller et al. | 455/114.3 |
| 2006/0240786 A1 | 10/2006 | Liu | |
| 2008/0187035 A1* | 8/2008 | Nakamura et al. | 375/232 |
| 2009/0252255 A1* | 10/2009 | Lee et al. | 375/297 |
| 2009/0302940 A1* | 12/2009 | Fuller et al. | 330/149 |
| 2010/0248658 A1* | 9/2010 | Pratt | 455/114.3 |
| 2012/0200355 A1* | 8/2012 | Braithwaite | 330/147 |
| 2012/0268191 A1* | 10/2012 | Ananthaswamy et al. | 327/358 |

FOREIGN PATENT DOCUMENTS

| | | |
|---|---|---|
| WO | 2007117187 | 10/2007 |
| WO | 2012066380 | 5/2012 |
| WO | 2012066383 | 5/2012 |

OTHER PUBLICATIONS

Raich, Raviv; Qian, Hua; and Zhou, G. Tong, "Orghogonal Polynomials for Power Amplifier Modeling and Predistorter Design," IEEE Transactions on Vehicular Technology, vol. 53, No. 5, Sep. 2004, pp. 1468-1479.

* cited by examiner

*Primary Examiner* — Santiago Garcia
(74) *Attorney, Agent, or Firm* — Coats and Bennett, P.L.L.C.

(57) ABSTRACT

Methods and apparatus are disclosed for predistorting an input signal to compensate for non-linear distortions introduced by an electronic device, for example, a power amplifier. The non-linear effects of a power amplifier can be modeled using different behavior models. Coefficients for one behavior model can be converted into coefficients for a different behavior model using a conversion function. A conversion circuit implementing the conversion function can be used in between a predistorter and an adaptation circuit that use different models.

16 Claims, 9 Drawing Sheets

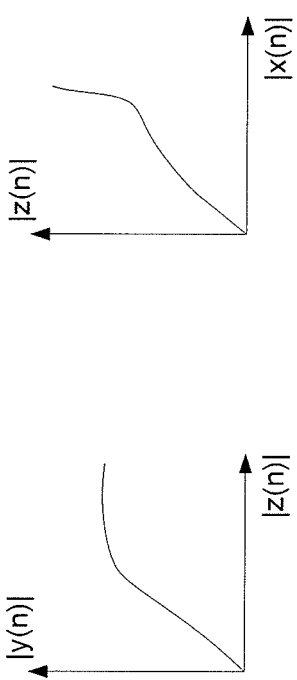
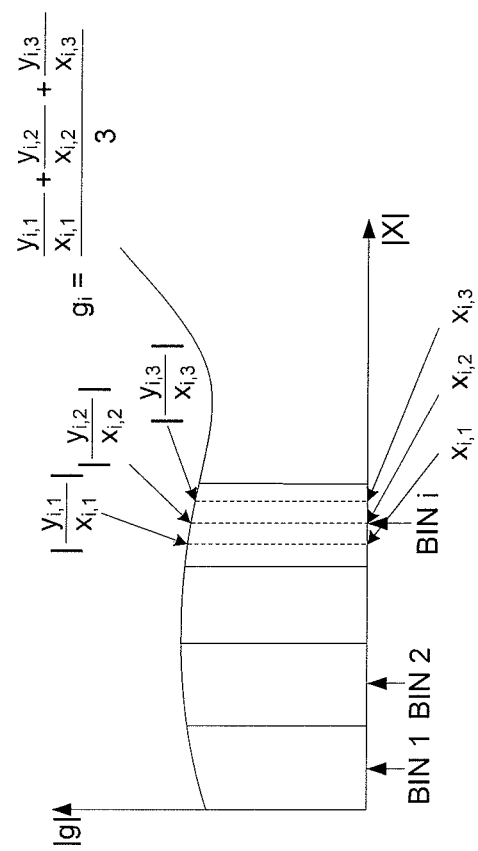
FIG. 6a FIG. 6b FIG. 6c FIG. 6d $$F_{ORTHO}(\cdot) = \mathbf{C} \cdot F_{POWER}(\cdot) \quad (8\text{-}1)$$

$$\mathbf{C} = \begin{pmatrix} c_{0,0} & c_{0,1} & c_{0,2} & \cdots & \cdots & c_{0,N-1} \\ c_{1,0} & c_{1,1} & c_{1,2} & \cdots & \cdots & c_{1,N-1} \\ \vdots & & & & & \vdots \\ c_{N-1,0} & c_{N-1,1} & c_{N-1,2} & \cdots & \cdots & c_{N-1,N-1} \end{pmatrix} \quad (8\text{-}2)$$

$$F_{POWER}(\cdot) = \mathbf{C}^{-1} * F_{ORTHO}(\cdot) \quad (8\text{-}3)$$

FIG. 8

MODELING DIGITAL PREDISTORTER

TECHNICAL FIELD

The present invention relates generally to digital predistortion for compensating an input signal for distortion introduced by an electronic device.

BACKGROUND

The design of radio-frequency power amplifiers for communications applications often involves a trade-off between linearity and efficiency. Power amplifiers are typically most efficient when operated at or near the saturation point. However, the response of the amplifier at or near the point of saturation is non-linear. Generally speaking, when operating in the high-efficiency range, a power amplifier's response exhibits nonlinear and memory effects.

One way to improve a power amplifier's efficiency and its overall linearity is to digitally pre-distort the input to the power amplifier to compensate for the distortion introduced by the power amplifier. In effect, the input signal is adjusted in anticipation of the distortion to be introduced by the power amplifier, so that the output signal is largely free of distortion products. Adaptive digital predistortion is a proven technology that can achieve high linearity and efficiency in power amplifiers. Generally, an adaptive digital predistorter is implemented based on a behavior model. The behavior model can be adapted by an adaptation circuit to model the distortions introduced by a particular power amplifier.

Two types of behavior models are commonly used in digital predistorters. One type of behavior models is neural network based and the other is polynomial function based. In a polynomial function based behavior model (referred to as "PF model" hereafter) a non-linear function is represented by a weighted sum of collection of basis functions. The collection of basis functions may be a set of power series functions or a set of orthogonal basis functions. In the present application, for notational simplicity, a behavior model based on a set of power series functions is referred to as a PSF model and a behavior model based on a set of orthogonal basis functions is referred to as an OBF model. A non-linear function can also be implemented by a look-up table. A behavior model for a digital predistorter based on look-up tables is referred to as a LUT model hereafter.

An adaptive digital predistorter can be implemented based on any one of the three models, PSF, OBF and LUT. However, the complexity of the adaptive digital predistorter varies depending on the model used. As an adaptive digital predistorter needs to be adapted or trained for a particular power amplifier by an adaptation circuit, the complexity of the adaptation circuit depends on the model as well.

Besides complexity, other factors, such as costs, stability, dynamic range, are also important in selecting a model for both predistorter circuit and adaptation circuit. When the model selected for a predistorter circuit is different from the model selected for an adaptation circuit, conversion techniques are required to convert model coefficients trained in the adaptation circuit to coefficients suitable for the predistorter circuit model.

SUMMARY

The present invention provides methods and apparatus for predistorting an input signal to compensate for non-linearity in an electronic device that operates on the input signal. Different models are available for constructing a digital predistorter, for example, a PSF, OBF, or LUT model. During the training process of a digital predistorter, an adaptation circuit is used to adapt the model of the digital predistorter to a particular power amplifier.

When implementing a predistorter, some models may be preferred to other models. But models that are desirable for implementing a predistorter may be undesirable when implementing an adaptation circuit. In embodiments of the present invention, a digital predistorter may be implemented using a model different than the model used by the adaptation circuit. In such case, a conversion process converts coefficients of the model used in the adaptation circuit into model coefficients suitable for use in the adaptive digital predistorter.

In some exemplary embodiments, methods are provided for compensating, in a predistorter, for distortions of an input signal by an electronic device that operates on the input signal to produce an output signal. In one exemplary method, a predistorter generates a predistorted signal for an electronic device. The electronic device takes the predistorted signal as input and generates an output signal. Based on the predistorted signal and output signal from the electronic device, a first set of model coefficients is generated using a first predistorter model. The first predistorter model is used to model the electronic device. From the first set of model coefficients, a second set of model coefficients for a second predistorter model are generated by applying a conversion function to the first set of model coefficients. The second predistorter model is used to configure the predistorter.

In other exemplary embodiments of the invention, a circuit is provided to compensate for distortions introduced by an electronic device. The circuit comprises an adaptation circuit, a coefficient conversion circuit, and a first modeling circuit. The adaptation circuit comprises a second modeling circuit and is configured to compute a first set of model coefficients for a first predistorter model. The coefficient conversion circuit is configured to generate a second set of model coefficients for a second predistorter model. The first modeling circuit is configured to adapt the predistorter using the second set of model coefficients based on the second predistorter model.

Of course, the present invention is not limited to the features, advantages, and contexts summarized above, and those familiar with pre-distortion circuits and techniques will recognize additional features and advantages upon reading the following detailed description and upon viewing the accompanying drawings.

BRIEF DESCRIPTION OF THE DRAWINGS

FIGS. 6a, 6b, 6c, and 6d are graphs illustrating the steps of constructing a look-up table.

FIG. 8 illustrates exemplary matrix operations of converting a first set of digital predistorter coefficients into a second set of digital predistorter coefficients.

DETAILED DESCRIPTION

Figure 1:
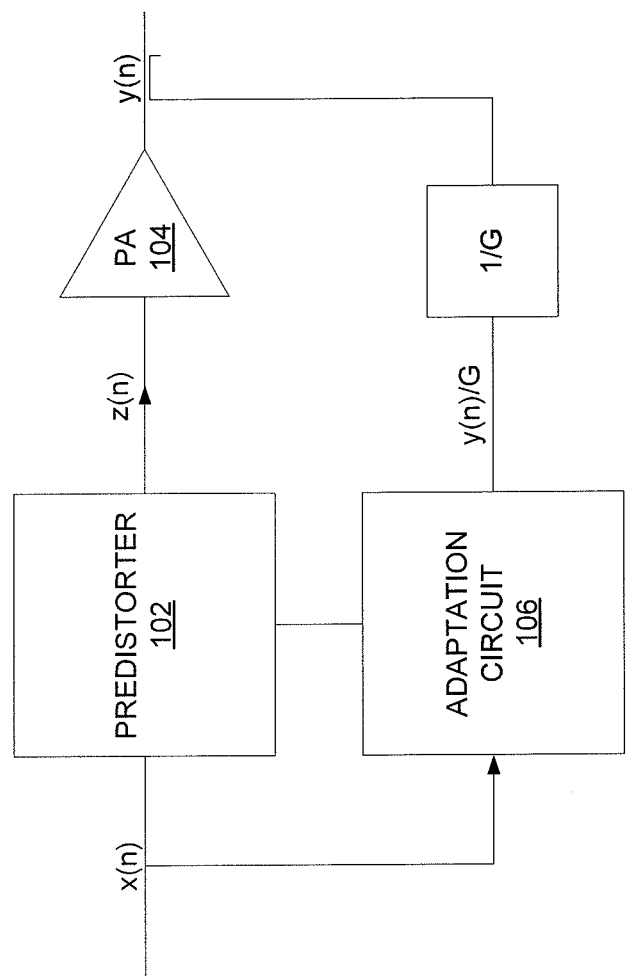
FIG. 1 illustrates an amplifier circuit including a digital predistorter and an adaptation circuit.

Referring now to the drawings, FIG. 1 illustrates a digital predistortion system 100 configured to compensate for the distortion introduced to a communication signal by a power amplifier 104. A power amplifier 104 is typically most efficient when it is operating in a non-linear range. However, the non-linear response of the power amplifier 104 causes out-of-band emissions and reduces the spectral efficiency in a communication system. A predistorter 102 may be used to improve power amplifier efficiency and linearity by distorting the input signal to the power amplifier 104 to compensate for the non-linear distortion introduced by the power amplifier 104. The cascading of a predistorter 102 and power amplifier 104 improves the linearity of the output signal and thus allows a power amplifier 104 to operate more efficiently. Although predistortion is used in the circuits and systems described herein to linearize the output of a power amplifier 104, those skilled in the art will appreciate that the techniques described are more generally applicable to linearize the output of any type of non-linear electronic device.

As seen in FIG. 1, an input signal x(n) is input to the predistorter 102. The predistorter 102 predistorts the input signal x(n) to compensate for the distortion introduced by the power amplifier 104 when the power amplifier 104 operates in a non-linear range. The predistorted output signal z(n) produced by the predistorter 102 is then applied to the input of the power amplifier 104. The power amplifier 104 amplifies the predistorted input signal z(n) to produce an output signal y(n). An adaptation circuit 106 adapts the predistorter 102 and generates model coefficients to properly configure the predistorter 102 based on the input signal to the predistorter 102, x(n), and the amplified signal output by the power amplifier 104, y(n), scaled down by the gain factor G. If the predistorter 102 is properly configured, the output signal y(n) contains fewer distortion products and out-of-band emissions than if power amplifier 104 were used alone.

Figure 2:
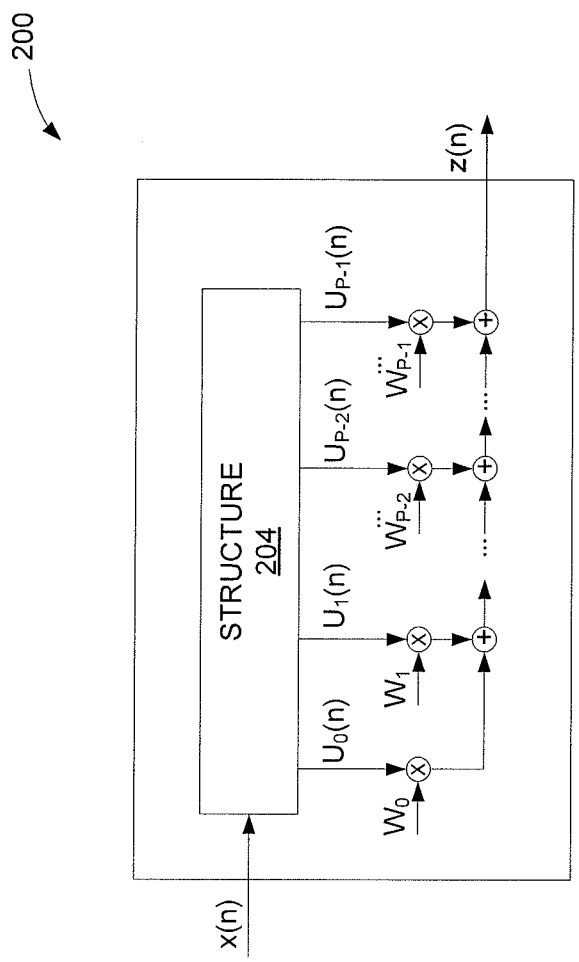
FIG. 2 illustrates a general model for both a power amplifier and a predistorter.

FIG. 2 illustrates a generalized predistorter model, which may represent the distortions introduced by the power amplifier 104 or the pre-distortion transfer function of the predistorter 102. In FIG. 2, the predistorter model 200 comprises a structure 204 having P output taps, labeled $u_0(n)$ to $u_{P-1}(n)$. Each of these output taps corresponds to a basis function in a predetermined basis function set.

The structure 204 operates on the input signal x(n) to produce data samples $\{u_0(n), u_1(n), \ldots u_{P-1}(n)\}$. The distortion modeling circuit 200 computes a sum of the scaled data samples, $\{u_0(n), u_1(n), \ldots u_{P-1}(n)\}$ to obtain a distorted signal z(n), which is the input signal to the power amplifier 104. Each data sample, $u_i(n)$, is scaled by a coefficient $w_i(n)$. The set of coefficients, $\{w_0(n), w_1(n), \ldots w_{P-1}(n)\}$, may be derived by the adaptation circuit 106. The distortion modeling circuit 200 can be used to implement a PSF or OBF model.

The predistorter model can also be implemented by means of a look-up table. In some embodiments, a LUT type predistorter maintains a look-up table that lists, for each reference signal, a gain factor. The reference signal represents the input to the predistorter. The gain factor represents the adjustment to be applied to the input signal. In a LUT type predistorter, the output of the predistorter is the product of the input signal and the gain factor. A LUT model usually involves operations such as interpolation using cubic spline techniques, but does not require multiplication, significantly reducing the costs. This is because a circuit implementing a LUT model does not need multipliers. A LUT model also has a fixed input range and is easy to modify to include memory effects. However, when using a LUT model in an adaptation circuit, a separate adaptation process or training process is needed for each entry in the look-up table. The computation complexity of a LUT model increases dramatically when the number of entries of the look-up table increases. The computation complexity of a LUT model also increases when advanced interpolation schemes are used. Therefore, a LUT model is not suitable for use in an adaptation circuit.

On the other hand, a PSF or OBF model is more suitable than a LUT model for use in the adaptation circuit 106. A PSF or OBF model usually has a small number of coefficients that need to be trained. The adaptation circuit 106 used to train a PSF or OBF model therefore is less complex. On the other hand, a PSF or OBF model is not as suitable as a LUT model for use in a predistorter, because, for example, a large number of multiplication operations are required by a PSF or an OBF model. Multiplication operations are costly to implement in a modeling circuit. It is therefore advantageous to use different models for a predistorter and its adaptation circuit.

Figure 3:
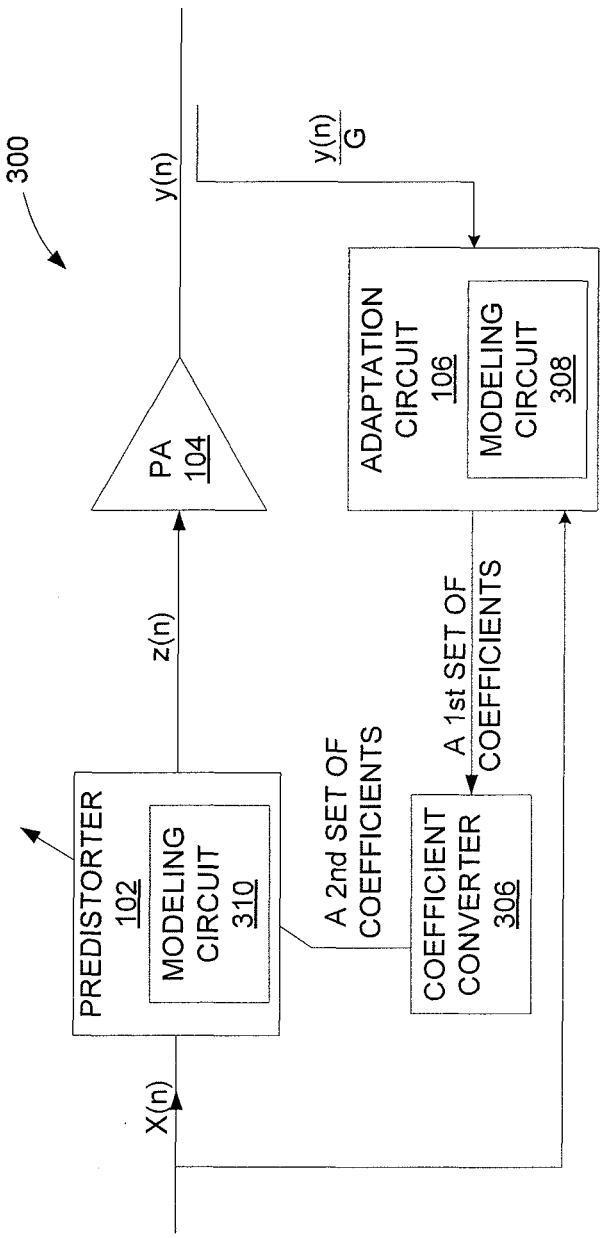
FIG. 3 illustrates an exemplary amplifier circuit including a digital predistorter and an adaptation circuit implemented with different adaption models.

FIG. 3 illustrates an amplifier circuit 300 according to one exemplary embodiment. The amplifier circuit 300 includes a predistorter 102, a power amplifier 104, an adaptation circuit 106, and a coefficient converter 306. In FIG. 3, a signal x(n) is input to the predistorter 102. The predistorter 102 includes a modeling circuit 310 that implements a predistorter model to predistort the input signal x(n) to compensate for the distortions to be introduced by the power amplifier 104. The predistorted signal z(n) is input to the power amplifier 104, which amplifies the predistorted signal z(n) to output an amplified signal y(n) that is free or substantially free of non-linear distortions. The adaption circuit 106 includes a modeling circuit 308 which trains or adapts a predistorter model based on the input signal x(n) and the scaled power amplifier output signal $$\frac{y(n)}{G}.$$

The predistorter model implemented in the modeling circuit 310 and in the modeling circuit 308 can be a LUT model, a PSF or an OBF model. The two predistorter models can be the same or different. In FIG. 3, the two predistorter models used by the modeling circuits 308 and 310 are different.

When the model adopted by the modeling circuit 310 is different from the model used by the modeling circuit 308, the coefficients generated by the adaptation circuit 106 need to be converted by the coefficient converter 306. The coefficient converter 306 converts a first set of coefficients, which are fitted by the adaptation circuit 106 based on the model used in the modeling circuit 308, into a second set of coefficients for use by the modeling circuit 310 in the predistorter 102.

Figure 4:
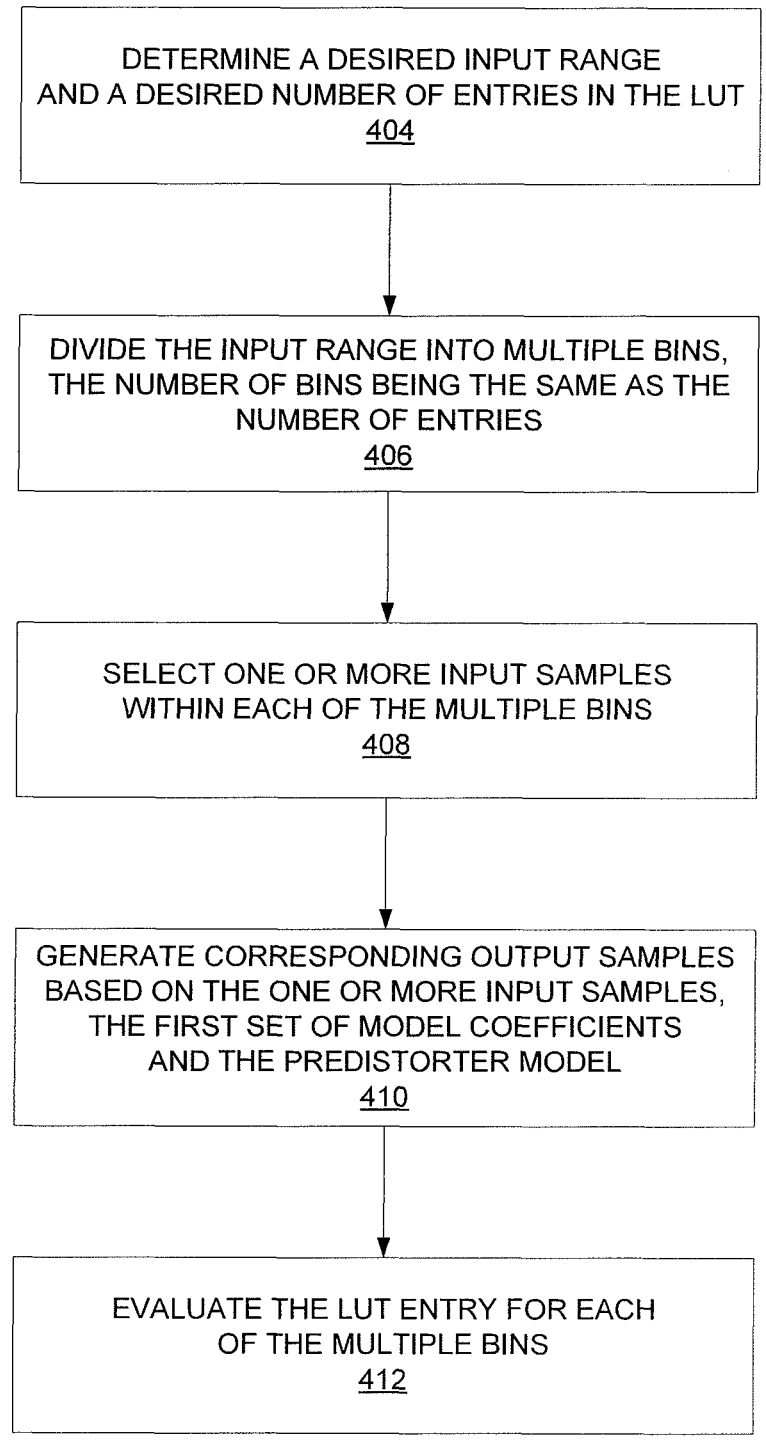
FIG. 4 is a flow chart illustrating how to convert a OBF model to a LUT model.

FIG. 4 is a flow diagram illustrating one embodiment of the coefficient converter 306. In this embodiment, the predistorter 102 uses a LUT model and the adaptation circuit 106 uses an OBF model. The coefficient converter 306 converts the coefficients generated by the adaptation circuit into entries of the look-up table used by the predistorter 102.

In FIG. 4, the coefficient converter 306 first determines a desired input range and a desired number of entries for the look-up table (step 404). In some embodiments, the input range is usually larger than or equal to the dynamic range of the magnitude of input signal x(n). The number of entries for the look-up table may be selected based on a predetermined criterion. For example, the number of entries in a look-up table should be large enough to ensure that the output signals are relatively accurate, when the output signal is computed for an input signal that falls between two LUT entries using, for example, curve fitting. Yet to reduce memory space and to improve speed, the look-up table should not be overly large. A compromise between these two concerns can help determine an appropriate size of the look-up table.

In FIG. 4, in step 404, the desired input range determined is divided into a number of bins (step 406). The number of bins equals the size of the look-up table or the number of LUT entries. Within each bin, one or more input samples may be taken (step 408). For each input sample, a corresponding output sample is generated based on the first set of model coefficients generated by the modeling circuit 308 and the model used by the modeling circuit 308 (step 410). In some embodiments, the output sample may be produced in a processing circuit that implements the set of basis functions used in the modeling circuit 200 in FIG. 2. An input sample may be used to excite the set of basis functions and the responses from each basis function are then combined using the weights generated by the coefficient evaluation circuit of the modeling circuit 308, for example, the first set of coefficients generated by the coefficient derivation circuit of the modeling circuit 308. For each input sample, $x_{i,j}$, a corresponding output sample $y_{i,j}$ is generated (step 410). Repeat step 410 for every input sample in each bin. There are several approaches to derive entries for a LUT table from the obtained input/output sample values, $x_{i,j}$ and $y_{i,j}$. The simplest approach is to use the average of the ratio of $$\frac{x_{i,j}}{y_{i,j}}$$

obtained for every sample in each bin as the entry in the LUT table for that particular bin. In such approach, each entry in the LUT is a gain factor for an input sample in the corresponding bin. This corresponds to the 0-th order interpolation of the LUT entries in the predistorter. More sophisticated algorithms involve solving n-th interpolation equations for the gain factor.

After repeating step 410 for every input sample in a particular bin, an LUT entry for that bin is generated (step 412). An LUT table can be established by repeating the same process for each of the multiple bins.

Figure 5:
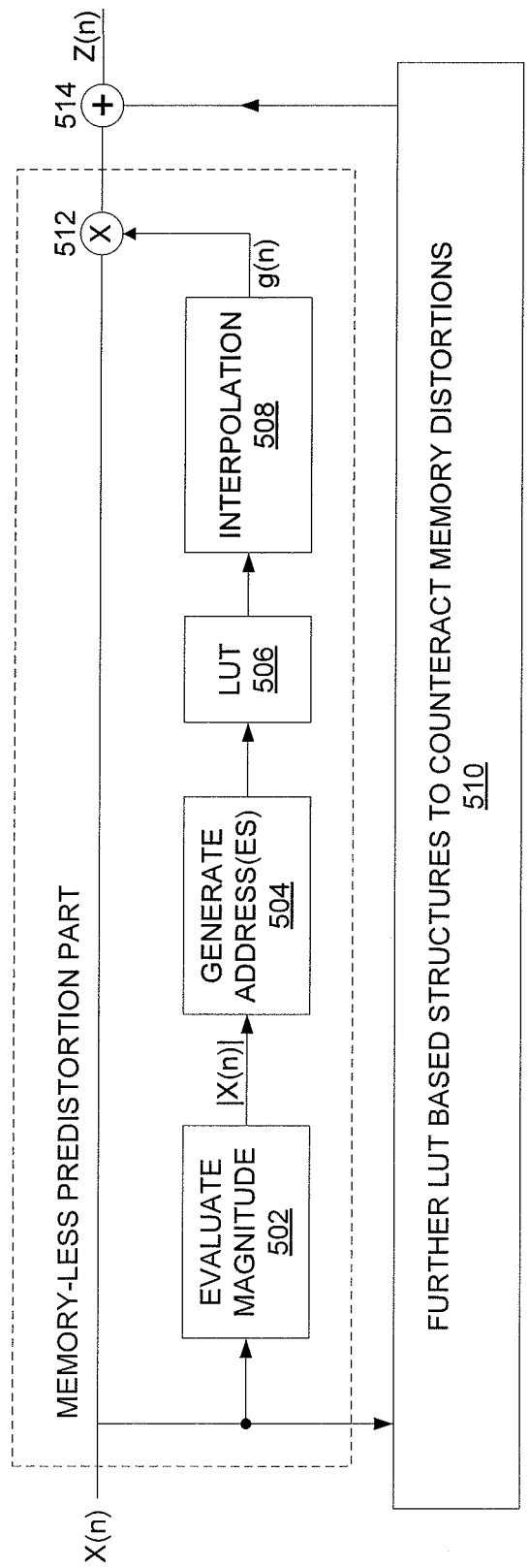
FIG. 5 illustrates an exemplary circuit implementing a digital predistorter based on a look-up table.

Once an LUT table has been established, a LUT model can be constructed based on the LUT table. FIG. 5 illustrates an exemplary circuit implementing an LUT model to generate an output signal z(n) for each input signal x(n). FIG. 5 comprises a circuit 502 for evaluating the magnitude of the input signal x(n), a circuit 504 for generating addresses as an index for searching in a LUT table, a LUT table 506, an interpolation circuit 508 that generates a gain factor g(n). FIG. 5 further comprises a multiplier 512 which multiplies the gain factor g(n) with the input signal x(n) and a summer 514 which modifies the output from the multiplier 512 with corrections to counteract memory distortions. The output from the summer 514 is the output signal z(n).

In the LUT table 506, each entry in the LUT table is a gain factor for the corresponding bin. FIG. 6c is a graph showing the gain factors as a function of the magnitude of the input samples |x(n)|. FIG. 6c may be derived from the combined responses of the predistorter 102 (FIG. 6b) and the power amplifier 104 (FIG. 6a).

FIG. 6a illustrates the magnitude of the response of the power amplifier 104, |y(n)|, as a function of the magnitude of the input signal |z(n)| to the power amplifier 104. FIG. 6b illustrates the magnitude of the response of the predistorter 102, |z(n)|, as a function of the magnitude of the input signal, |x(n)|.

In FIG. 6c, the x-axis represents the input signal and the y-axis represents $$\left| \frac{y_i}{x_i} \right|,$$

i.e., the magnitude of the gain factor. The input range of the input signal is divided into a number of bins, bin1, bin2, bin3 . . . etc. Inside each bin, bin i, three input samples are selected. For each input sample $x_{i,j}$, there is a corresponding output sample $y_{i,j}$. The gain factor for each of the three input samples are averaged to generate an entry $L_i$ for the look-up table in the input range represented by bin i.

FIG. 6d illustrates an exemplary look-up table. For each address(bin) i, the LUT entry is designated as $g_i$. In some embodiments, $g_i$ is determined from an average value of the gain factors obtained for each of the input samples in bin i.

Besides a look-up table based behavior model, the predistorter can also use PSF models. When the modeling circuits 308 and 310 use the same behavior model, there is no need to convert the first set of coefficients generated by the modeling circuit 308 into a second set of coefficients for use by the predistorter 102. The first set of coefficients can be used directly to configure the predistorter 102. When the predistorter 102 and the adaptation circuit 106 use different models, for example, orthogonal basis function based versus power series basis function based model, the coefficient converter 306 essentially represents a matrix multiplication operation that converts a first set of coefficients, $(w_1, w_2, \ldots w_p)^T$ into a second set of coefficients, $(w_1', w_2', \ldots w_p')^T$.

Figure 7:
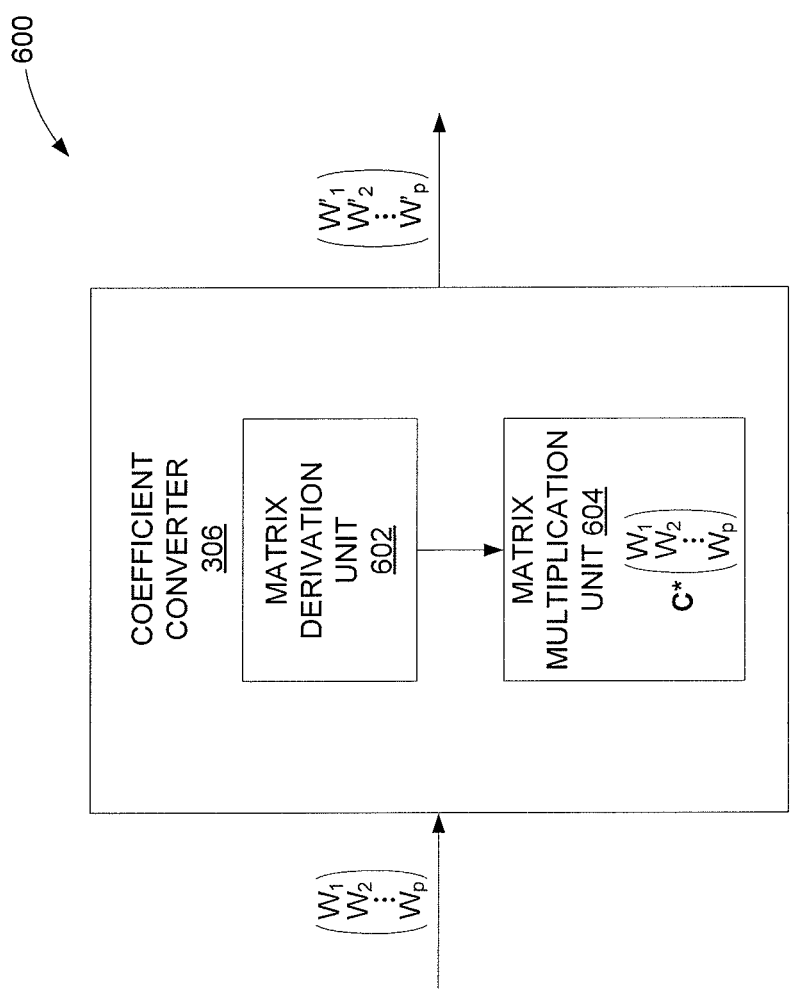
FIG. 7 illustrates an exemplary coefficient converter.

FIG. 7 is a block diagram illustrating one exemplary implementation of the coefficient converter 306. The coefficient converter 306 converts the input P×1 vector $(w_1, w_2, \ldots w_p)^T$ into the output P×1 vector $(w_1', w_2', \ldots w_p')^T$. The coefficient converter 306 comprises a matrix derivation unit 602 and a matrix multiplication unit 604. The matrix derivation unit 602 derives a conversion matrix C which is used by the matrix multiplication unit to compute an output vector from the input vector.

FIG. 8 illustrates the relationship between matrix C and two sets of basis functions, a set of power series basis functions, $F_{power}(\bullet)$ and a set of orthogonal basis functions, $F_{ortha}(\bullet)$. It is noted that Equation (8.1) is a set of equations that express each orthogonal basis function in terms of the power series basis functions. For example: one equation in the set of equations (8.1) may be expressed as:

$$F_{ortho,1}() = C_{0,1} F_{power,1}() + C_{0,2} F_{power,2}() + \ldots + C_{0,P-1} F_{power,P-1}().$$

Essentially, the elements in matrix C are the coefficients for the orthogonal basis function model computed by the coefficient evaluation circuit of the modeling circuit 308. The matrix multiplication circuit 604 receives matrix C as input and carries out the multiplication and summation operations embodied in Equation (8.2) shown in FIG. 8.

As mentioned above, Equation (8.1) illustrates Matrix C as related to the set of power series basis functions and the set of orthogonal basis functions. Equation (8.1) is applicable to those embodiments in which the predistorter 102 uses an OBF model and the adaptation circuit 208 uses a PSF model.

When the models used by the predistorter 102 and the adaptation circuit 106 are switched, the relationship between matrix C and the two sets of basis functions are reversed, as shown in Equation (8.3). In such case, the matrix derivation unit 602 needs to perform an additional matrix inversion operation to derive $C^{-1}$. The rest structure of the coefficient converter 306 remains unchanged.

Figure 9:
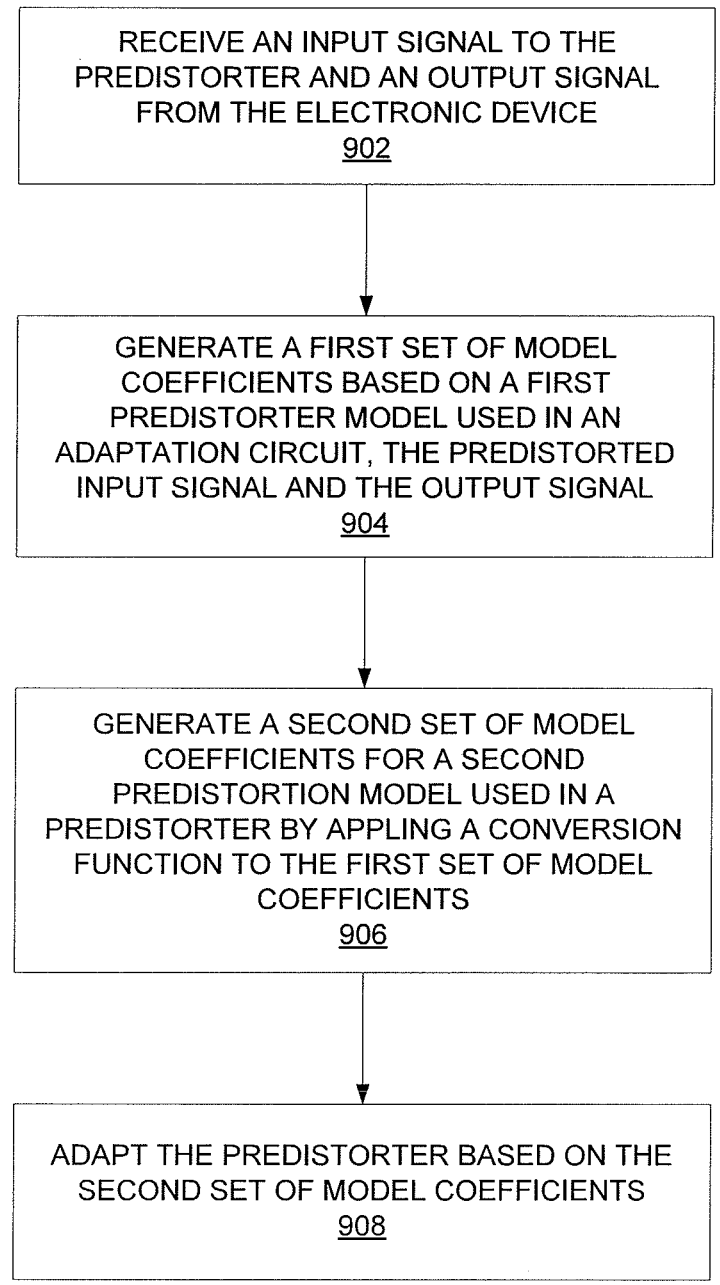
FIG. 9 is a flow diagram illustrating the steps of converting one set of digital predistorter coefficients into a second set of digital predistorter coefficients.

FIG. 9 is a flow chart describing the procedure implemented in the power amplifier circuit 300. The adaptation circuit 106 receives a signal x(n) which is an input signal to the predistorter 102 and a signal $$\frac{y(n)}{G}$$

which is a scaled output signal from the electronic device, e.g., the power amplifier 104 (step 902). G represents the net gain achieved by the power amplifier 104. Scaling the output signal y(n) by the inverse of the gain G permits the non-linearities introduced by the power amplifier 104 to be analyzed independently from its gain. Based on the input signal to the predistorter and the output signal of the power amplifier, the modeling circuit 308 generates a first set of model coefficients for a first predistorter model, for example, a PSF or OBF model (step 904). The coefficient converter 306 generates a second set of model coefficients by applying a conversion function to the first set of model coefficients (step 906). The second set of model coefficients are generated for a second predistorter model used by the predistorter 102. The predistorter 102 can be adapted based on the second set of model coefficients (step 908).

The foregoing description and the accompanying drawings represent non-limiting examples of the methods and apparatus taught herein. As such, the present invention is not limited by the foregoing description and accompanying drawings. Instead, the present invention is limited only by the following claims and their legal equivalents.

What is claimed is:

1. A method of compensating for distortions introduced by an electronic device, comprising:
   receiving an input signal to a predistorter and an output signal from the electronic device;
   generating a first set of model coefficients based on a first predistorter model used in an adaptation circuit, the input signal to the predistorter, and the output signal;
   generating a second set of model coefficients for a second predistorter model by applying a conversion function to the first set of model coefficients, wherein the second predistorter model is used by the predistorter;
   adapting the predistorter based on the second set of model coefficients; and
   predistorting input signals to the predistorter based on the second predistorter model.

2. The method of claim 1, wherein the first predistorter model comprises a set of polynomial basis functions.

3. The method of claim 2, wherein the set of polynomial basis functions includes a set of orthogonal basis functions.

4. The method of claim 2, wherein the set of polynomial basis functions includes a set of power basis functions.

5. The method of claim 2, wherein the second predistorter model is based on a look-up table (LUT) and the second set of model coefficients corresponds to entries in the LUT.

6. The method of claim 5, wherein generating the second set of model coefficients comprises:
   determining a desired input range for the LUT and a desired number of entries in the LUT;
   dividing the input range into multiple bins, the number of bins being the same as the number of entries;
   selecting one or more input samples within each of the multiple bins;
   generating output samples corresponding to the one or more input samples based on the one or more input samples, the first set of model coefficients and the first predistorter model; and
   evaluate a LUT entry for each of the multiple bins.

7. The method of claim 3, wherein the second predistorter model is a set of power basis functions, and wherein the conversion function is a matrix.

8. The method of claim 4, wherein the second predistorter model is a set of orthogonal basis functions, and wherein the conversion function is a matrix.

9. A circuit for compensating for distortions introduced by an electronic device to produce a predistorted input signal, wherein the electronic device operates on an input signal to a predistorter, said circuit comprising:
   an adaptation circuit configured to compute a first set of model coefficients for a first predistorter model from the input signal to the predistorter;
   a coefficient conversion circuit configured to generate a second set of model coefficients for a second predistorter model from the first set of model coefficients; and
   a modeling circuit configured to adapt the predistorter based on the second set of model coefficients.

10. The circuit of claim 9, wherein the first predistorter model comprises a set of polynomial basis functions.

11. The circuit of claim 10, wherein the set of polynomial basis functions is a set of orthogonal basis functions.

12. The circuit of claim 10, wherein the set of polynomial basis functions is set of power basis functions.

13. The circuit of claim 10, wherein the second predistorter model is based on a look-up table (LUT), and the second set of model coefficients corresponds to entries in the LUT.

14. The circuit of claim 13, wherein the coefficient conversion circuit is configured to:
   determine a desired input range for the LUT and a desired number of entries in the LUT;
   divide the input range into multiple bins, the number of bins being the same as the number of entries;
   select one or more input samples within each of the multiple bins;
   generate output samples corresponding to the one or more input samples based on the one or more input samples, the first set of model coefficients and the first predistorter model, wherein the output samples represent a gain factor over the corresponding input samples; and
   evaluate a LUT entry based on the corresponding output samples for each of the multiple bins.

15. The circuit of claim 11, wherein the second predistorter model is a set of power basis functions, and wherein the conversion function is a matrix.

16. The method of claim 12, wherein the second predistorter model is a set of orthogonal basis functions, and wherein the conversion function is a matrix.

* * * * *

UNITED STATES PATENT AND TRADEMARK OFFICE
CERTIFICATE OF CORRECTION

Page 1 of 1

PATENT NO. : 8,787,494 B2
APPLICATION NO. : 13/493434
DATED : July 22, 2014
INVENTOR(S) : Bai It is certified that error appears in the above-identified patent and that said Letters Patent is hereby corrected as shown below:

On the title page item (56), under "OTHER PUBLICATIONS", in Column 2, Line 1, delete ""Orghogonal" and insert -- "Orthogonal --, therefor.

In the drawings

In Fig. 9, Sheet 9 of 9, in Box "906", in Line 4, delete "APPLING" and insert -- APPLYING --, therefor.

In the specification

In Column 6, Line 50, delete "$F_{ortha}(\bullet)$." and insert -- $F_{ortho}(\bullet)$. --, therefor.

In the claims

In Column 8, Line 62, in Claim 16, delete "method" and insert -- circuit --, therefor.

Signed and Sealed this
Thirty-first Day of May, 2016

Michelle K. Lee
*Director of the United States Patent and Trademark Office*